United States Patent
Lai et al.

(10) Patent No.: US 8,766,319 B2
(45) Date of Patent: Jul. 1, 2014

(54) SEMICONDUCTOR DEVICE WITH ULTRA THIN SILICIDE LAYER

(75) Inventors: Kuo-Chih Lai, Tainan (TW); Chia Chang Hsu, Kaohsiung (TW); Nien-Ting Ho, Tainan (TW); Bor-Shyang Liao, Kaohsiung (TW); Shu Min Huang, Tainan (TW); Min-Chung Cheng, Chiayi County (TW); Yu-Ru Yang, Hsinchu County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 40 days.

(21) Appl. No.: 13/456,238

(22) Filed: Apr. 26, 2012

(65) Prior Publication Data

US 2013/0288456 A1  Oct. 31, 2013

(51) Int. Cl.
  *H01L 31/0328*  (2006.01)
  *H01L 31/0336*  (2006.01)
  *H01L 31/072*   (2012.01)
  *H01L 31/109*   (2006.01)

(52) U.S. Cl.
  USPC ........... 257/192; 257/368; 257/377; 257/382; 257/E27.059; 257/E27.06

(58) Field of Classification Search
  CPC ............ H01L 17/0886; H01L 27/0294; H01L 27/10826; H01L 27/10879; H01L 27/1211; H01L 29/785

USPC .............. 257/59, 72, 347, 377, 382, E29.117, 257/E29.273, 192, 368, 369, E27.059, 257/E27.06, E51.006
  See application file for complete search history.

(56) References Cited

U.S. PATENT DOCUMENTS

| | | |
|---|---|---|
| 6,043,138 A | 3/2000 | Ibok |
| 6,492,216 B1 | 12/2002 | Yeo |
| 6,921,963 B2 | 7/2005 | Krivokapic |
| 7,087,477 B2 | 8/2006 | Fried |
| 7,091,551 B1 | 8/2006 | Anderson |
| 7,247,887 B2 | 7/2007 | King |
| 7,250,658 B2 | 7/2007 | Doris |
| 7,309,626 B2 | 12/2007 | Ieong |
| 7,352,034 B2 | 4/2008 | Booth, Jr. |
| 7,470,570 B2 | 12/2008 | Beintner |
| 7,531,437 B2 | 5/2009 | Brask |
| 7,569,857 B2 | 8/2009 | Simon, legal representative |
| 7,851,287 B2 * | 12/2010 | Kim et al. ............ 438/197 |
| 2004/0195624 A1 | 10/2004 | Liu |
| 2005/0051825 A1 | 3/2005 | Fujiwara |
| 2006/0099830 A1 | 5/2006 | Walther |
| 2006/0286729 A1 | 12/2006 | Kavalieros |
| 2007/0108528 A1 | 5/2007 | Anderson |
| 2007/0158756 A1 | 7/2007 | Dreeskornfeld |
| 2008/0157208 A1 | 7/2008 | Fischer |
| 2009/0124097 A1 | 5/2009 | Cheng |
| 2009/0242964 A1 | 10/2009 | Akil |

(Continued)

*Primary Examiner* — Hoai V Pham
(74) *Attorney, Agent, or Firm* — Winston Hsu; Scott Margo (57) ABSTRACT

A manufacturing method of a semiconductor device comprises the following steps. First, a substrate is provided, at least one fin structure is formed on the substrate, and a metal layer is then deposited on the fin structure to form a salicide layer. After depositing the metal layer, the metal layer is removed but no RTP is performed before the metal layer is removed. Then a RTP is performed after the metal layer is removed.

2 Claims, 7 Drawing Sheets

(56) References Cited

U.S. PATENT DOCUMENTS

| | | |
|---|---|---|
| 2009/0269916 A1 | 10/2009 | Kang |
| 2010/0048027 A1 | 2/2010 | Cheng |
| 2010/0072553 A1 | 3/2010 | Xu |
| 2010/0144121 A1 | 6/2010 | Chang |
| 2010/0167506 A1 | 7/2010 | Lin |
| 2011/0001169 A1* | 1/2011 | Ozcan et al. ............ 257/213 |
| 2011/0147840 A1 | 6/2011 | Cea |

* cited by examiner

SEMICONDUCTOR DEVICE WITH ULTRA THIN SILICIDE LAYER

BACKGROUND OF THE INVENTION

1. Field of the Invention

The present invention relates to a manufacturing method of semiconductor device, and more particularly, a method for forming a silicide layer on a fin structure.

2. Description of the Prior Art

Metal-oxide-semiconductors (MOS) are devices widely used in semiconductor integrated circuits. The quality of a MOS is particularly affected by the performances of the source and the drain. The gate usually comprises a polysilicon layer as a main conductive layer, and the source/drain region is formed on the silicon substrate by an implant process, a silicide layer is then formed on the polysilicon layer through a thermal process in order to decrease the sheet resistance of the gate and improve the operating speed of the MOS.

Some non-planar FET structures, such as finFETs, have well developed in recent years, by improving the channel width of the MOS and the density of the integrated circuits, and have been therefore widely used in the semiconductor industry. With the thickness of the fin getting always thinner, it becomes harder to form a silicide on the fin. Additionally, during the process for forming the silicide, an over heating during the thermal process may cause the silicide to penetrate the silicon substrate and may increase the leakage current, thereby further influencing the quality of the finFET.

SUMMARY OF THE INVENTION

One of the objectives of the present invention is to provide a manufacturing method of a semiconductor device, forming a silicide layer on a fin structure, and decreasing the occurrence of leakage current.

The present invention provides a manufacturing method of a semiconductor device, comprising the following steps: first, a substrate is provided, with at least one fin structure on the substrate. A metal layer is deposited on the fin structure to form a silicide layer. The metal layer is removed, without any RTP (Rapid Thermal Process) before the metal layer is removed, and a RTP is performed after the metal layer is removed.

The present invention provides another manufacturing method of a semiconductor device, comprising the following steps: providing a substrate, with at least one fin structure on the substrate, depositing a metal layer on the fin structure, performing a low-temperature thermal process on the fin structure to form a silicide layer, then removing the metal layer, and performing a RTP after the metal layer is removed.

The present invention provides a semiconductor device, comprising: a substrate with at least one fin structure on the substrate, wherein a silicide layer is deposited on a surface and two sidewalls of the fin structure, and wherein the thickness of the silicide layer is uniform; and a plurality of contacts disposed on the silicide layer.

During the process for forming the silicide layer in the present invention, there is no RTP performed after the metal layer is deposited and before the metal layer is removed, or only a low-temperature thermal process (80° C. to 120° C.) is performed, which is better adapted to form a ultra-thin silicide on the surface of the fin structure, to decrease the occurrence of leakage current and to improve the efficacy of the semiconductor device.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
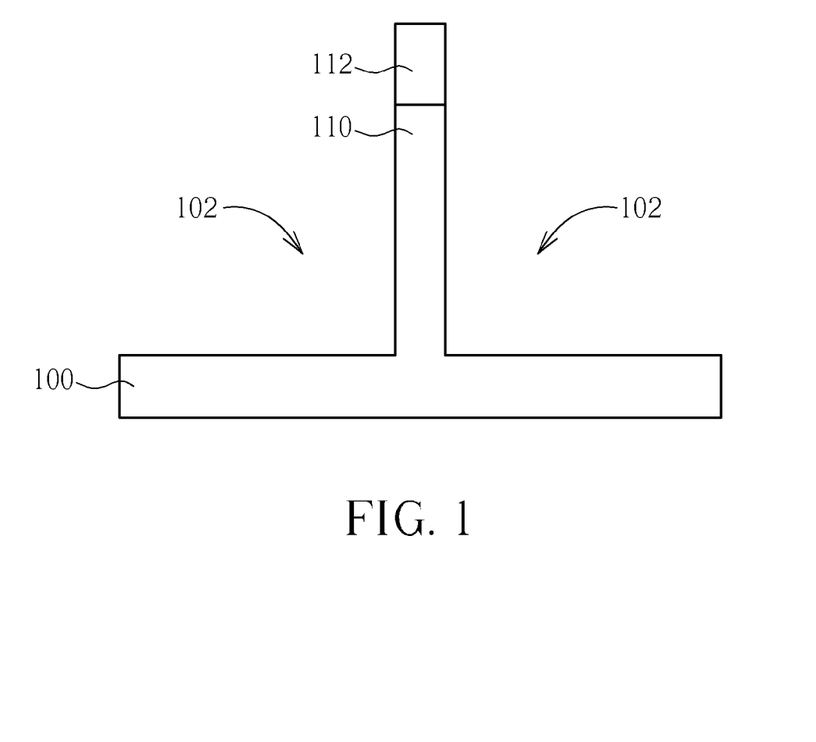
FIGS. 1-7 are schematic diagrams illustrating a manufacturing method of the semiconductor device according to a first preferred embodiment of the present invention.

Please refer to FIGS. 1-7. FIGS. 1-7 are schematic diagrams illustrating a manufacturing method of the FinFET according to a first preferred embodiment of the present invention. The manufacturing method of the semiconductor device in this embodiment includes the following steps: first, as shown in FIG. 1, a substrate 100 is provided, such as a silicon substrate, an epitaxial silicon substrate, a silicon germanium substrate or a silicon carbide substrate. The first preferred embodiment of the present invention uses bulk silicon as substrate, but is not limited to. A cap layer 112 is formed on the substrate 100, and a buffer layer (not shown) may be formed between the substrate 100 and the cap layer 112. In one embodiment of the present invention, the material of the cap layer 112 can comprise silicon nitride (SiN) or APF (advanced pattern film, provided by Applied Materials), and the material of the buffer layer could be silicon oxide (SiO2) etc. The cap layer 112 is at least partially removed through a photo-etch process, as well as parts of the substrate 100, so as to form a fin structure 110, wherein the width of each fin structure 110 is about 10 nm, and then form a plurality of trenches 102 on the substrate simultaneously.

Figure 2:
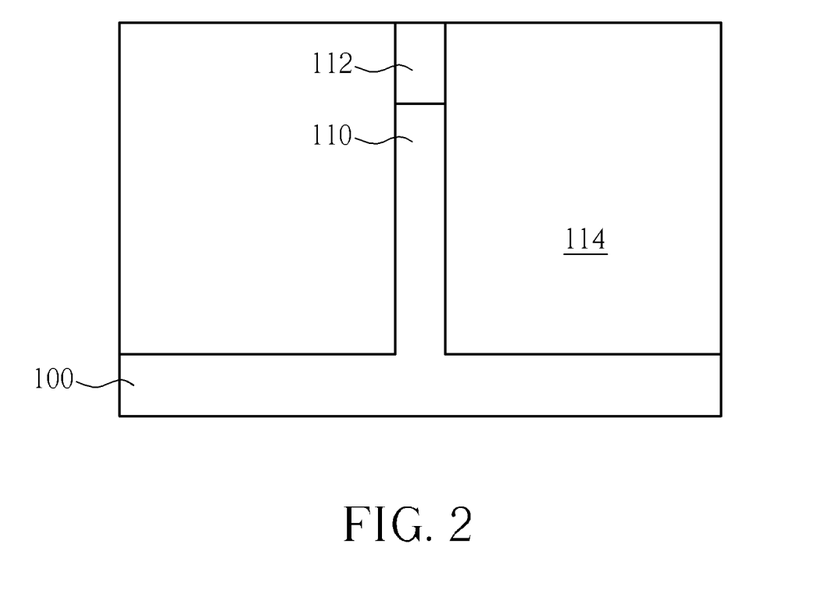

As shown in FIG. 2, a dielectric layer 114 is entirely formed on the substrate 100, the cap layer 112 and in each trench 102. A planarization process, such as a chemical mechanical polishing (CMP) process, is then performed on the dielectric layer 114, using the cap layer as the stop layer, in order to expose the top surface of the cap layer 112. The dielectric layer 114 may be a single or a multi-material layer, comprising shallow trench isolation (STI) material. The procedures are well known to persons of ordinary skills in the art and the details will not be described here.

Figure 3:
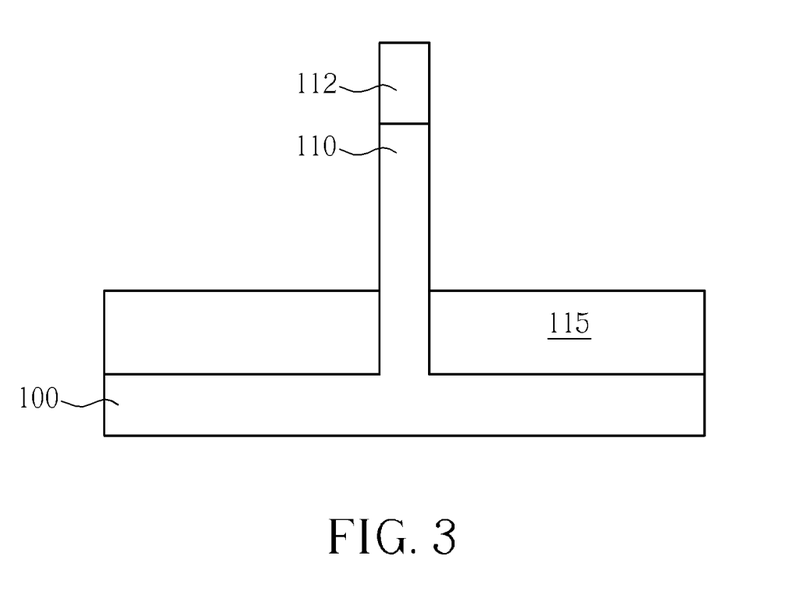

As shown in FIG. 3, the dielectric layer 114 is then partially removed by an etching process to form shallow trench isolations (STI) 115 in each trench 102, as insulation structures between each of the fin structures. The etching may be carried out through a dry etching process, such as $CF_4$, $O_2$ and Ar, or a wet etching process, such as dilute HF. In addition, in another embodiment, the dielectric layer 114 maybe removed by an etching process to form the STI 115 directly, with no planarization process performed onto.

Figure 4:
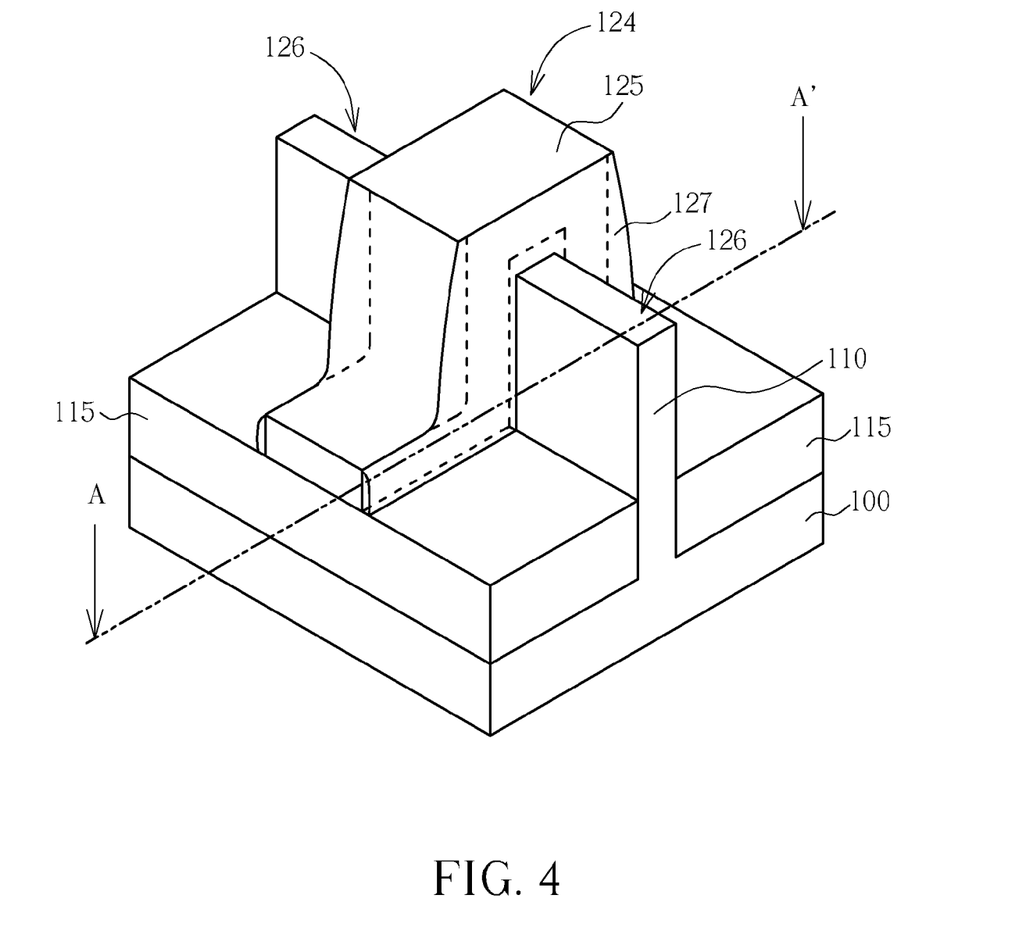

After the cap layer 112 is removed, as shown in FIG. 4, a gate 124 is formed to cover parts of the fin structure 110, the gate 124 comprises a dielectric layer (not shown), a conductive layer (not shown) and a mask layer 125, wherein the dielectric layer includes SiN or $SiO_2$, the conductive layer includes metal or polysilicon, the mask layer 125 includes SiN or $SiO_2$. Additionally, the present invention could be integrated with a high-k first gate last process, a high-k first last gate last process or a gate first process and other metal gate processes. Besides, a second cap layer (not shown) could be selectively formed between the fin structure 110 and the dielectric layer, and the dielectric layer is preferably a high dielectric constant (high-k) material layer, which could be selected from the group of hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$, zirconium silicon oxide ($ZrSiO_4$), hafnium zirconium oxide ($HfZrO_4$), strontium bismuth tantalite ($SrBi_2Ta_2O_9$, SBT), lead zirconate titanate, ($PbZr_xTi_{1-x}O_3$, PZT) and barium strontium titanate ($Ba_xSr_{1-x}TiO_3$, BST).

In a following step, a spacer 127 is formed to cover the sidewalls of the gate 124, and a source/drain region (S/D region) 126 is then formed through an implant process on the exposed fin structure 110 (where it is not covered by the gate 124). Additionally, before or after forming the S/D region 126, an epitaxy layer 120, such as SiGe or SiC, can be formed on the surface of the fin structure 110 selectively, or parts of the S/D region 126 can be and replaced by the epitaxy layer 120. Besides, the epitaxy layer 120 may be conformal, hexagonal, octagon or polygonal.

Figure 5:
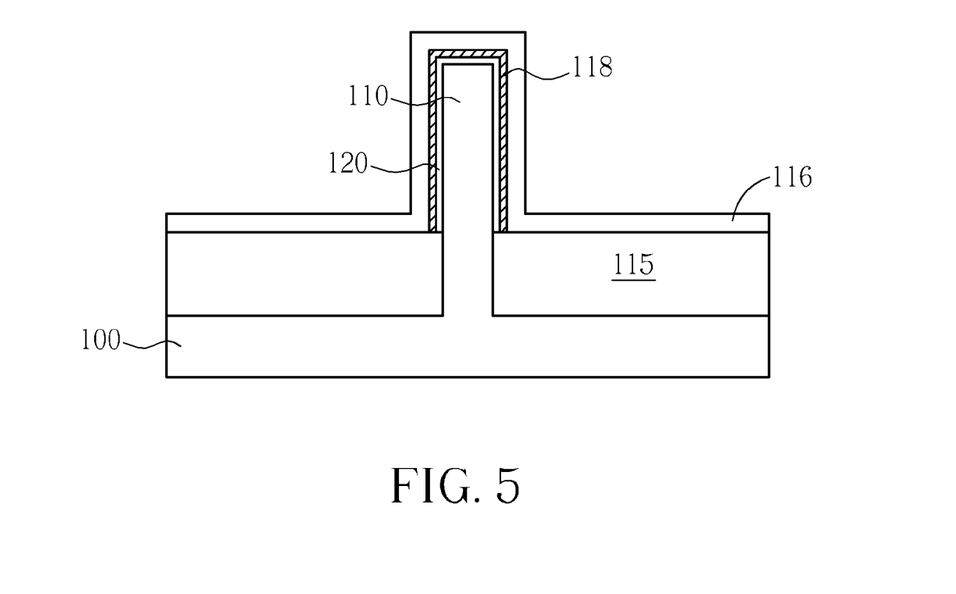

Please refer to FIG. 5, FIG. 5 is a schematic diagram illustrating the section line AA' in FIG. 4. In this embodiment a conformal epitaxy layer 120 is provided (but not limited thereto), and a metal layer 116 is then deposited on the gate 124 and on the fin structure 110 (or on the S.D region 126). A silicide layer 118 will be formed on the interface while the metal layer 116 is deposited on the fin structure 110 (or on the epitaxy layer 120). In other words, the surface of the epitaxy layer 120 (or the surface of the fin structure 110) will form an ultra-thin silicide layer, wherein the thickness of the silicide layer 118 is only from 2 nm to 4 nm, and the thickness of the silicide layer 118 is uniform, covering the top surface and two sidewalls of the fin structure 110. In this embodiment, the silicide layer 118 is enough to decrease the interface resistance between the metal and silicon and improving the conductive efficacy. The material of the metal layer 116 maybe a Ni/Pt alloy and the material of the silicide layer 118 maybe $Ni_2S$, but is not limited thereto. In the present invention, the epitaxy layer 120 covering the S/D region 126 may provide extra silicon atoms during the self-aligning process, hence, after the silicide layer 118 is formed, the fin structure 110 covered by the silicide layer 118 will not be consumed completely. In other words, the fin structure 110 will still be between the two sidewalls of the silicide layer 118. The silicide layer 118 can prevent current leakage, increases the channel width, and moreover, provides a suitable stress to increase the mobility in the semiconductor.

Figure 6:
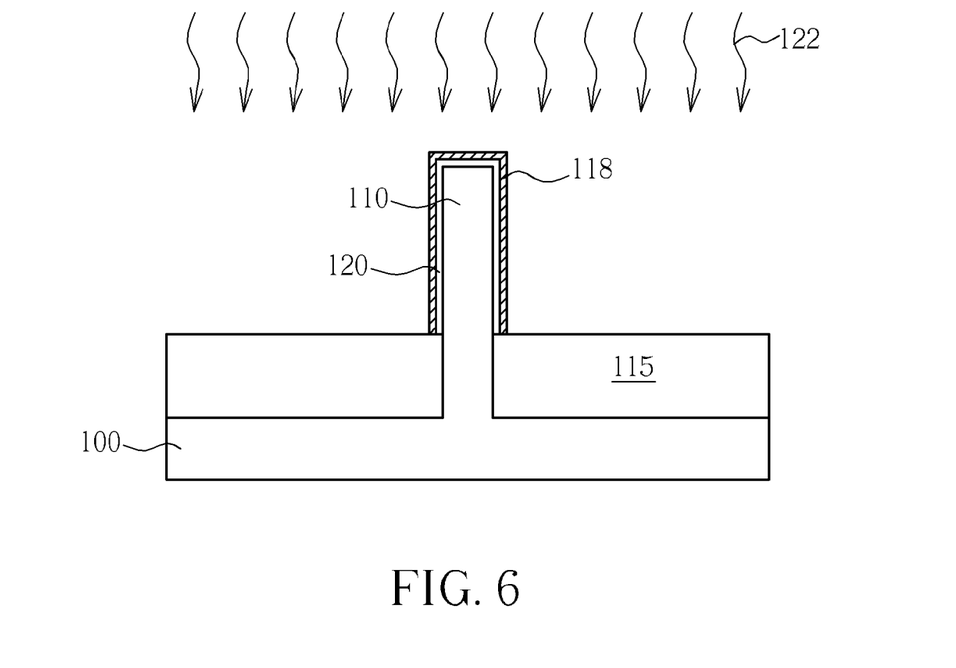

After the metal layer 116 is removed, as shown in FIG. 6, a RTP 122 is performed on the silicide layer 118, wherein the temperature of the RTP 122 is between 400° C. to 600° C., which further decreases the resistance of the silicide layer 118 by, for example, converting the silicide layer 118 from $Ni_2Si$ into NiSi.

It is worth noting that in this embodiment, there only one RTP is performed during the self-aligned silicide process, the RTP 122 is performed after the metal layer 116 removed, and no other RTP are performed before the metal layer 116 is removed, thereby avoiding the current leakage, and affecting the quality of the semiconductor device. In other words, in this embodiment, there are no additional RTP during the steps from depositing the metal layer 116 to removing the metal layer 116. This way excessive transformation into NiSi in the fin structure 110 or in substrate 100 is avoided, thereby decreasing the current leakage of the semiconductor device.

Figure 7:
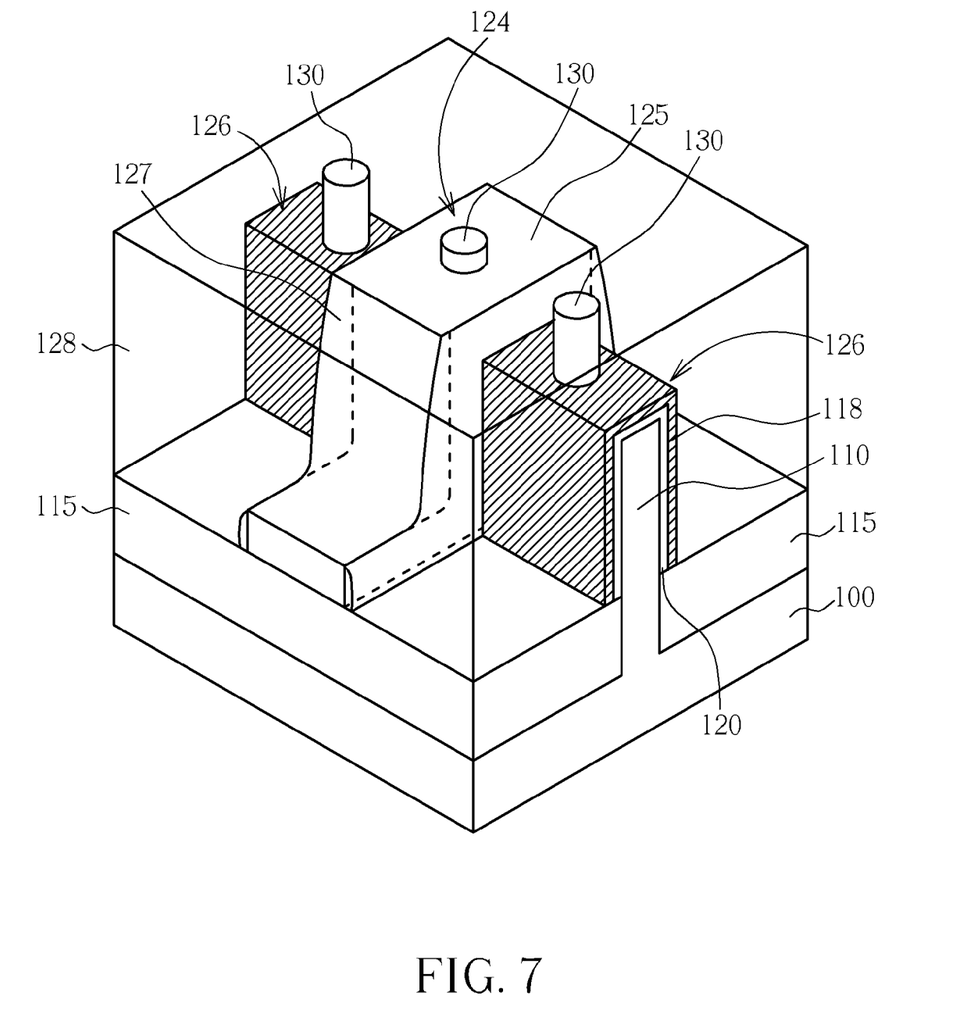

As shown in FIG. 7, a dielectric layer 128 is formed on the surface of the substrate 110 and covers the gate 124, the silicide layer 118 and the fin structure 110, and a plurality of contact 130 is formed in the dielectric layer 128 to electrically connect the gate 124 and the silicide layer 118 that is on the S/D region 126. In addition, this embodiment can also be integrated with a post-contact process, which means that after the dielectric layer 128 is formed on the gate and the fin structure 110, a plurality of contact holes (not shown) is formed in the dielectric layer 128, thereby exposing the S/D region 126, and the self-aligning process is performed, including depositing a metal layer, removing the metal layer and performing a RTP once, to obtain an ultra-thin silicide layer only in the contact holes.

The following description will detail the different embodiments of the silicide layer and the manufacturing method of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 8:
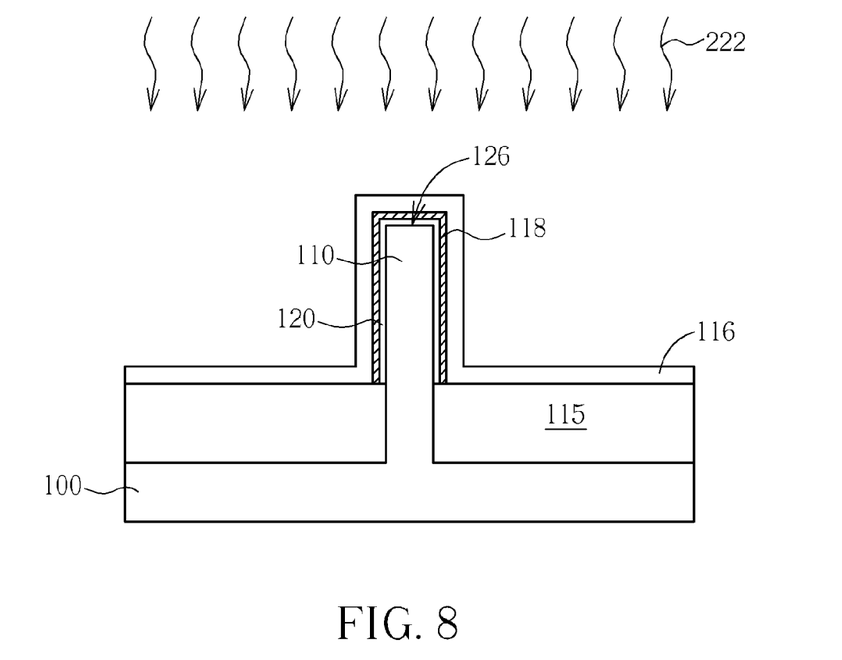
FIGS. 8-9 are schematic diagrams illustrating a manufacturing method of the semiconductor device according to a second preferred embodiment of the present invention.
Figure 9:
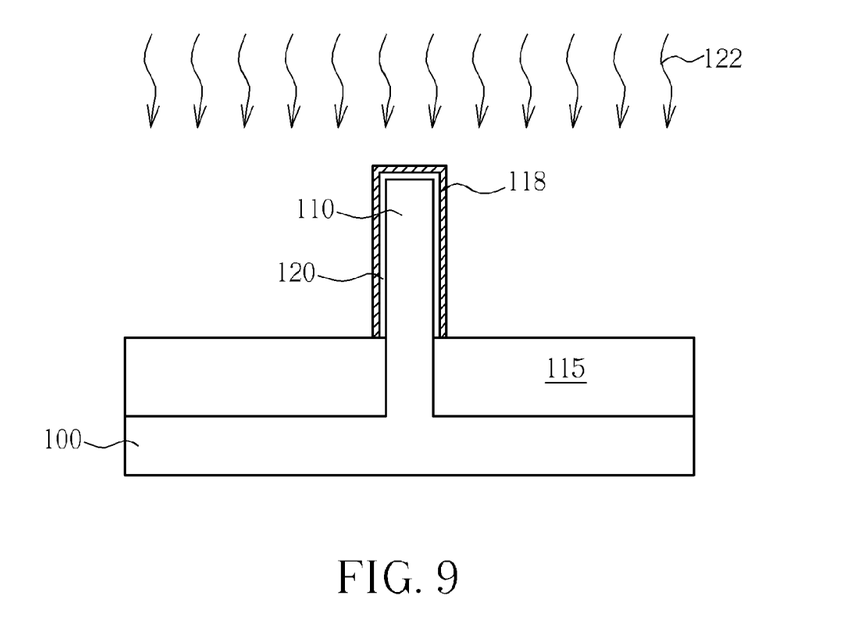

FIGS. 8-9 are schematic diagrams illustrating a manufacturing method of the semiconductor device according to the second preferred embodiment of the present invention. Please refer to FIG. 8, a structure 110 and at least one fin structure on the substrate, a gate, a cap layer and a spacer (not shown) are sequentially formed on the fin structure 110. Using an implant process, an S/D region 126 is formed on the surface of the fin structure 110. Then a metal layer 116 and a mask layer (not shown) are selectively formed on the S/D region 126. In addition, an epitaxy layer 120 is selectively formed on the surface of the fin structure 110 before the metal layer 116 is deposited. In this embodiment, the difference with the first preferred embodiment is that another low-temperature thermal process 222 is performed after the metal layer 116 is deposited on the fin structure 110 or on the epitaxy layer 120. The low-temperature thermal process 222 is about 50° C. to 150° C., preferably between 80° C. and 120° C. The low-temperature thermal process 222 is performed to adjust the thickness of the silicide layer 118, to increase the thickness of the silicide layer 118, but not excessively and to avoid current leakage. Except for the additional low-temperature thermal process, the other steps and elements in this embodiment are similar to the steps and elements in the first preferred embodiment, as shown in FIG. 9, which are: removing the metal layer 116, performing a RTP 122, forming the dielectric layer and the contacts. Similarly, the invention may comprise a plurality of fin structures on the substrate, and may be integrated with post-contact processes, wherein the contacts may comprise pole contacts or slot contacts.

Figure 10:
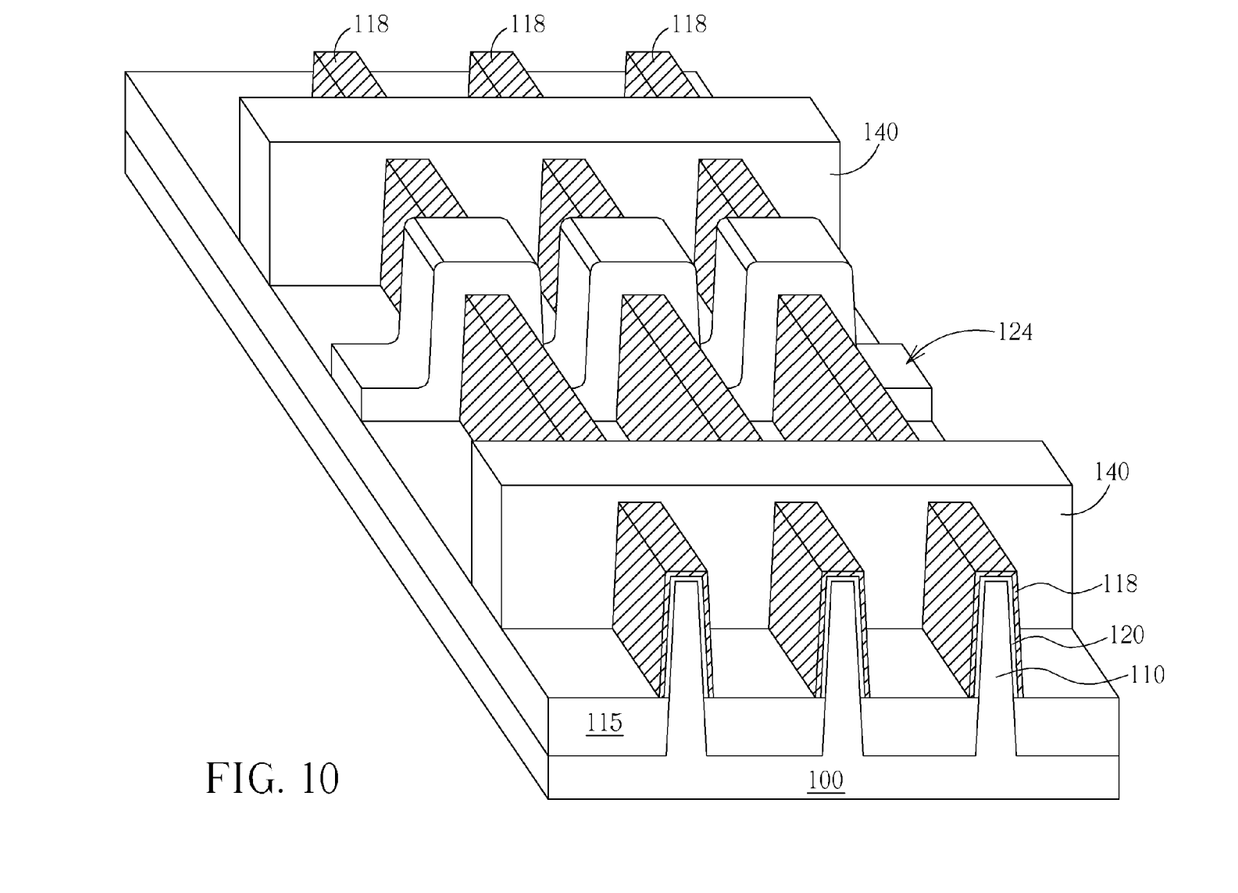
FIG. 10 is a schematic diagram illustrating the semiconductor device with a plurality of fin structures and slot contacts.

Even though the preferred embodiment mentioned above describes only one fin structure on the substrate, it is not limited thereto. In other words, the invention may comprise a plurality of fin structures on the substrate. In addition, the contact 130 mentioned above is not limited to a pole contact, it could also be a slot contact and be across several fin structures. For example, as shown in FIG. 10, which is the schematic diagram illustrating the semiconductor device with a plurality of fin structures 110 and with a plurality of slot contacts 140, other components, material properties, and manufacturing method of the semiconductor device are similar to the first and the second preferred embodiment detailed above and will not be redundantly described.

To summarize the above descriptions, the present invention provides a manufacturing method of a semiconductor device, its specific feature is not to perform any additional thermal process or only performing a low-temperature thermal process (80° C. to 120° C.) after depositing metal layer, in order to control the thickness of the silicide layer. Besides, in the first preferred embodiment of the present invention, no additional thermal process is carried out, which reduces the costs and improves the producing efficiency. The invention can be widely applied in many kinds of semiconductor devices, decreasing the interface resistance and avoiding current leakage. It furthermore improves the yield of the manufacturing process significantly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate, with a plurality of fin structures on the substrate;
   a silicide layer deposited on a surface and two sidewalls of each fin structure, wherein the thickness of the silicide layer is uniform; and the thickness of the silicide layer is between 2-4 nanometers; and
   a plurality of slot contacts, each slot contact disposed on a plurality of fin structures.

2. The semiconductor device of claim 1, wherein each fin structure is between two sidewalls of the silicide layer.

* * * * *